(12) United States Patent
Bhavnagarwala (10) Patent No.: US 11,984,887 B2
(45) Date of Patent: May 14, 2024

(54) CIRCUITS AND METHODS TO USE ENERGY HARVESTED FROM TRANSIENT ON-CHIP DATA

(71) Applicant: Azeez Bhavnagarwala, Newtown, CT (US)

(72) Inventor: Azeez Bhavnagarwala, Newtown, CT (US)

(73) Assignee: Metis Microsystems, LLC, Newtown, CT (US)

( * ) Notice: Subject to any disclaimer, the term of this patent is extended or adjusted under 35 U.S.C. 154(b) by 0 days.

(21) Appl. No.: 17/497,974

(22) Filed: Oct. 10, 2021

(65) Prior Publication Data

US 2023/0112781 A1 Apr. 13, 2023

Related U.S. Application Data

(60) Provisional application No. 63/139,744, filed on Jan. 20, 2021, provisional application No. 63/090,169, filed on Oct. 9, 2020.

(51) Int. Cl.
*H03K 19/00* (2006.01)
*G01R 19/165* (2006.01)
*H03K 19/094* (2006.01)
*H03K 19/096* (2006.01)
*H03K 19/20* (2006.01)

(52) U.S. Cl.
CPC ... *H03K 19/0019* (2013.01); *G01R 19/16552* (2013.01); *H03K 19/0013* (2013.01); *H03K 19/094* (2013.01); *H03K 19/0963* (2013.01); *H03K 19/20* (2013.01)

(58) Field of Classification Search
CPC .......... H03K 19/0963; H03K 19/0013; H03K 19/20; H03K 19/0185
See application file for complete search history.

(56) References Cited

U.S. PATENT DOCUMENTS

| 7,463,054 | B1 * | 12/2008 | Parris | H03K 19/0008 326/86 |
| 9,935,636 | B1 * | 4/2018 | Liran | H03K 19/018521 |
| 2008/0238474 | A1 * | 10/2008 | Fairbanks | H03K 19/01721 326/17 |
| 2014/0266327 | A1 * | 9/2014 | Ancis | H03K 19/0019 327/112 |

(Continued)

OTHER PUBLICATIONS

Alimadadi, Mehdi, et al., "A 4 GHz Non-Resonant Clock Driver With Inductor—Assisted Energy Return to Power Grid", IEEE Transactions on Circuits and Systems I: Regular Papers (Aug. 2010); 57(8): 2099-2108.

(Continued)

*Primary Examiner* — Tuan T Lam (57) ABSTRACT

Circuits and methods that use harvested electrostatic energy from transient: on-chip data are described in the Application. In one aspect, a method inverter circuit use harvested electrostatic charge held at any electric potential higher than the common ground reference potential of CMOS circuits in a chip, to partially drive a 0→1 logic transition at the output of the inverter at lower energy drain from the on-chip power grid than a conventional CMOS inverter with similar performance, slew rates at inverter input and output and with similar output driving transistor geometries.

20 Claims, 4 Drawing Sheets

(56) References Cited

U.S. PATENT DOCUMENTS

| | | |
|---|---|---|
| 2016/0254844 A1 | 9/2016 | Hull et al. |
| 2017/0116443 A1 | 4/2017 | Bolic et al. |
| 2022/0321123 A1 | 10/2022 | Bhavnagarwala |
| 2023/0268923 A1 | 8/2023 | Bhavnagarwala |

OTHER PUBLICATIONS

Athas, William C., et al., "A low-power microprocessor based on resonant energy", IEEE Journal of Solid-State Circuits (Nov. 1997); 32(11): 1693-1701.

Bhavnagarwala, Azeez, et al., "Fluctuation limits & scaling opportunities for CMOS SRAM cells", IEDM Technical Digest (Dec. 2005); 659-662.

Chen, Yu-Hsin, et al., "Understanding the Limitations of Existing Energy-Efficient Design Approaches for Deep Neural Networks", SYSML'18 (Feb. 2018); 3 pages.

Choe, Swee Yew, et al., "Dynamic Half Rail Differential Logic for Low Power", 1997 IEEE International Symposium on Circuits and Systems (Jun. 9-12, 1997); pp. 1936-1939.

Kim, Keejong, et al., "A Low-Power SRAM Using Bit-Line Charge-Recycling", IEEE Journal of Solid-State Circuits (Feb. 2008); 43(2): 446-459.

Kong, Bai-Sun, et al., "Charge recycling differential logic (CRDL) for low power application", IEEE Journal of Solid-State Circuits (Sep. 1996); 31(9): 1267-1276.

Lee, Jungho, et al., "Split-level precharge differential logic: a new type of high-speed charge-recycling differential logic", IEEE Journal of Solid-State Circuits (Aug. 2001); 36(8): 1276-1280.

Liu, Yong, et al., "A 0.1pJ/b 5-to-10Gb/s charge-recycling stacked low-power I/O for on-chip signaling in 45nm CMOS SOI", 2013 IEEE International Solid-State Circuits Conference Digest of Technical Papers (2013); 400-401.

Rajapandian, Saravanan., et al., "Energy-efficient low-voltage operation of digital CMOS circuits through charge-recycling", 2004 Symposium on VLSI Circuits. Digest of Technical Papers (IEEE Cat. No. 04CH37525), IEEE (2004); 330-331.

Svensson, Lars., "Adiabatic Switching", Low power digital CMOS design (1995); 181-218; Springer, Boston, MA.

Wilson, John M., et al., "8.6 A 6.5-to-23.3fJ/b/mm balanced charge-recycling bus in 16nm FinFET CMOS at 1.7-to-2.6Gb/s/wire with clock forwarding and low-crosstalk contraflow wiring", 2016 IEEE International Solid-State Circuits Conference (ISSCC). IEEE (2016); 156-157.

Yang, Byung-Do, "A Low-Power SRAM Using Bit-Line Charge-Recycling for Read and Write Operations", IEEE Journal of Solid-State Circuits (Oct. 2010); 45(10): 2173-2183.

Yang, Tien-Ju, et al., "Designing Energy-Efficient Convolutional Neural Networks Using Energy-Aware Pruning", Proceedings of the IEEE Conference on Computer Vision and Pattern Recognition (2017); pp. 6071-6079.

Extended European Search Report for EP Application No. 22202622.1, dated Apr. 4, 2023, 9 pages.

Non-Final Office Action for U.S. Appl. No. 17/498,220 dated Apr. 28, 2023, 5 pages.

Restriction Requirement for U.S. Appl. No. 17/951,050 dated Jun. 30, 2023, 4 pages.

Non-Final Office Action for U.S. Appl. No. 17/951,050 dated Mar. 1, 2024, 9 pages.

\* cited by examiner

CIRCUITS AND METHODS TO USE ENERGY HARVESTED FROM TRANSIENT ON-CHIP DATA

CROSS-REFERENCE TO RELATED APPLICATIONS

This application claims priority to and benefit of U.S. Provisional Application No. 63/090,169 filed on Oct. 9, 2020 and U.S. Provisional Application No. 63/139,744 filed on Jan. 20, 2021, the entire disclosures of each of which are incorporated herein by reference in its entirety.

FIELD OF INVENTION

The present invention relates to use of electrostatic energy harvested from transient on-chip data to improve the energy efficiency of digital CMOS circuit operation.

BACKGROUND OF INVENTION

In recent years, deep neural networks (DNNs) have become the solution for many AI applications including computer vision, speech recognition and robotics implementing machine learning methods. While these neural networks deliver sufficient accuracy—it comes at the cost of high computational complexity with associated power drain limiting deep learning from being deployed on mobile devices with limited energy budgets. Smart phones for example, cannot run object classification with AleXNet in real-time for more than an hour. Network issues of latency, bandwidth and availability could require battery/ambient powered IoT devices on the edge to not only sense and act without communicating to the cloud but also to take on more computationally intense tasks of learning or training a neural network. Neural networks for a myriad of IoT devices can easily result in model sizes that are enormous—becoming computationally burdensome to their energy resources, demanding energy budgets that exceed provisions from batteries and conventional energy harvesting methods. Even where power is abundantly available as in a data center supporting AI workloads, where GPU accelerators consume as much as 400 W, the cost of electricity and the performance limits imposed by heat removal efficiency can be improved by lowering the switching (or Dynamic) energy consumption of digital CMOS circuits.

PRIOR ART

In many applications requiring high speed CMOS circuit operation, precharged dynamic circuit techniques are preferred. These circuits are typically operated by pre-charging output nodes to the supply voltage during a pre-charge phase every clock cycle and conditionally discharging some of them, depending on the inputs during the evaluation phase. These techniques are energy inefficient since all of the charge discarded to the reference ground potential during evaluate must be resupplied during the precharge phase of the next clock cycle. High peak currents can also cause large di/dt noise causing voltage bumps in power rails associated risks to signal integrity and reliability in high performance CMOS components.

Dynamic logic circuits that recycle some of the charge were proposed to improve the energy efficiency of circuit operation. These circuit techniques precharge complementary outputs to half $V_{DD}$ by charge sharing from the previous evaluation state, enabling a maximum of a 50% reduction in energy. Such schemes are relevant only when complementary signal pairs are used in implementing complex logic functions. Also, much of the charge recycle benefits are lost with performance degraded as well due to (i) high overheads in device count (ii) requirement of using complementary inputs and as many as 2-3 clock and enable inputs to each logic gate with their associated additional routing, performance and power overheads (iii) use of cross-coupled inverters as output drivers which increase the uncertainty of gate metrics in the presence of parameter variations and the offsets they develop, and (iv) with only a half-$V_{DD}$ gate-source voltage precharged to output and input nodes of output drivers for charge recycle operation, gate overdrive is degraded during evaluation phase. In one comparison with static CMOS implementing full adders, the power-delay product of a full adder increases total energy nearly 10% over static CMOS. Moreover, neural network energy consumption is dominated by movement of data across the memory hierarchy and the chip and not by dissipation from computation.

On-chip small voltage swing signaling. schemes have attempted charge recycling by stacking components (such as logic and clocking circuits) with predictable data switching activities in two adjacent voltage domains using simple push-pull regulators to balance current between the two domains to maintain the voltage at their interface. This approach could deliver a maximum of a quadratic reduction in power. Inefficiency introduced by voltage regulation is eliminated if the current between domains is matched. An approach to stack voltage domains without requiring regulators between them has been reported using a balanced charge recycling bus where differing data activity between two links is compensated by swapping data between them periodically so that switching activity along the bus is exactly matched. These schemes however, are difficult to implement and also require circuits in the domains to be powered by reduced operating voltages.

Charge recycling techniques have been reported where the flow of electric charge from the supply rail ($V_{DD}$) to Ground is traced through more than one circuit/use through multiple voltage domains. However, there is no energy advantage from recycling the charge through multiple voltage domains since it costs as much in energy to rase share 0 the highe8t voltage domain as it does to de so cumulatively in each of the. stacked domains operating independently. The energy advantage of stacking voltage domains is only in removing the inefficiencies of on-chip voltage regulation from ($V_{DD}$) to much lower voltages that these domains would be powered with to benefit from quadratic reductions in their switching power. If the current between domains is not matched, the energy overhead consumed by regulators attempting to maintain domain interface at a fixed voltage, could diminish the quadratic energy improvements from operating each domain at reduced voltages.

Non-resonant approaches to returning/recycling stored on load capacitance include use of an inductor to discharge load capacitor of a clock network to the power grid instead of it being discharged to ground. However, overheads of inductors, decoupling capacitors, integration with clock gating (and its accompanying overheads), and limited application to large clock load capacitances (as seen in a clock mesh) are challenges seen with this approach making it impractical and difficult to implement.

Smaller voltage transitions for each logic, operation using 'recycled charge' also with the disadvantages of smaller margins and lower performance. In multiple instances, these make implementations impractical. For e.g., a smaller (than $V_{DD}$) voltage is applied across a BL pair during an SRAM Write operation to enable lower energy dissipation per Write Operation. By sharing/recycling charge across a set of BL pairs, Writes are attempted with smaller voltage swings on the BL (instead Of full rail-rail BL swings during a conventional SRAM Write). For small geometry devices it becomes harder to write to the bitcell even with the full supply voltage across a bit line pair —due to increasing electrical variability seen in small-geometry bitcell transistors. Circuit overheads introduced by full CMOS transmission gates to move charge between columns comes at a significant cost in area, control and performance.

Adiabatic switching in reversible logic circuits moves charge from the power supply to a load capacitance using slow constant current charging without energy dissipation. It enables the recycling of energy to reduce the total energy drawn from the power supply by reversing the current source using non-standard AC or pulsed power supplies with time varying voltage or current. In sharp contrast to conventional CMOS circuit operation, charge and energy are not discarded after being used only once—with pulsed/sinusoidal cower supplies designed to be able. to retrieve the energy fed back to it. The problem areas limiting realization of practical low-power operation of CMOS chips using adiabatic or reversible logic techniques; (1) the energy-efficient design of the combined power supply and clock generator (2) logical overhead needed to support reversible logic functions and (3) the alternative of scaling operating voltages with feature size and improving performance—that comes with conceptual simplicity and high payback of lower power dissipation, has: been preferred by industry.

SUMMARY OF INVENTION

Conventional CMOS operation as illustrated by an inverter driving a capacitive load C and which draws energy equal to $CV_{DD}^2$ from the power supply rail at voltage $V_{DD}$ during a 0→1 transition at its output, of which energy equal to $(½)CV_{DD}^2$ is stored at the output. A 1→0 transition at the output discharges all of this stored energy to the reference ground potential of the inverter at voltage Vss=0V.

In the proposed invention, an inverter driving the same capacitive load C as the above conventional CMOS inverter, draws energy equal to $\alpha CV_{DD}^2$ (where α is a positive fraction <1) from a grid/node capacitance holding harvested electrostatic charge at some intermediate electric potential V2 where V2≥Vss and V2≤Vss as the inverter uses this harvested charge to drive a 0→1 transition at its output, until the output voltage approaches V2 when the proposed circuit invention continues driving the output to $V_{DD}$ using electric charge from the power grid of the chip at electric potential $V_{DD}$ while consuming energy equal to only $\beta CB_{DD}^2$ where β is a positive fraction <1) with a α+β~1. Typical values of β are 0.6-0.75.

DETAILED DESCRIPTION OF PREFERRED EMBODIMENTS

Figure 1:
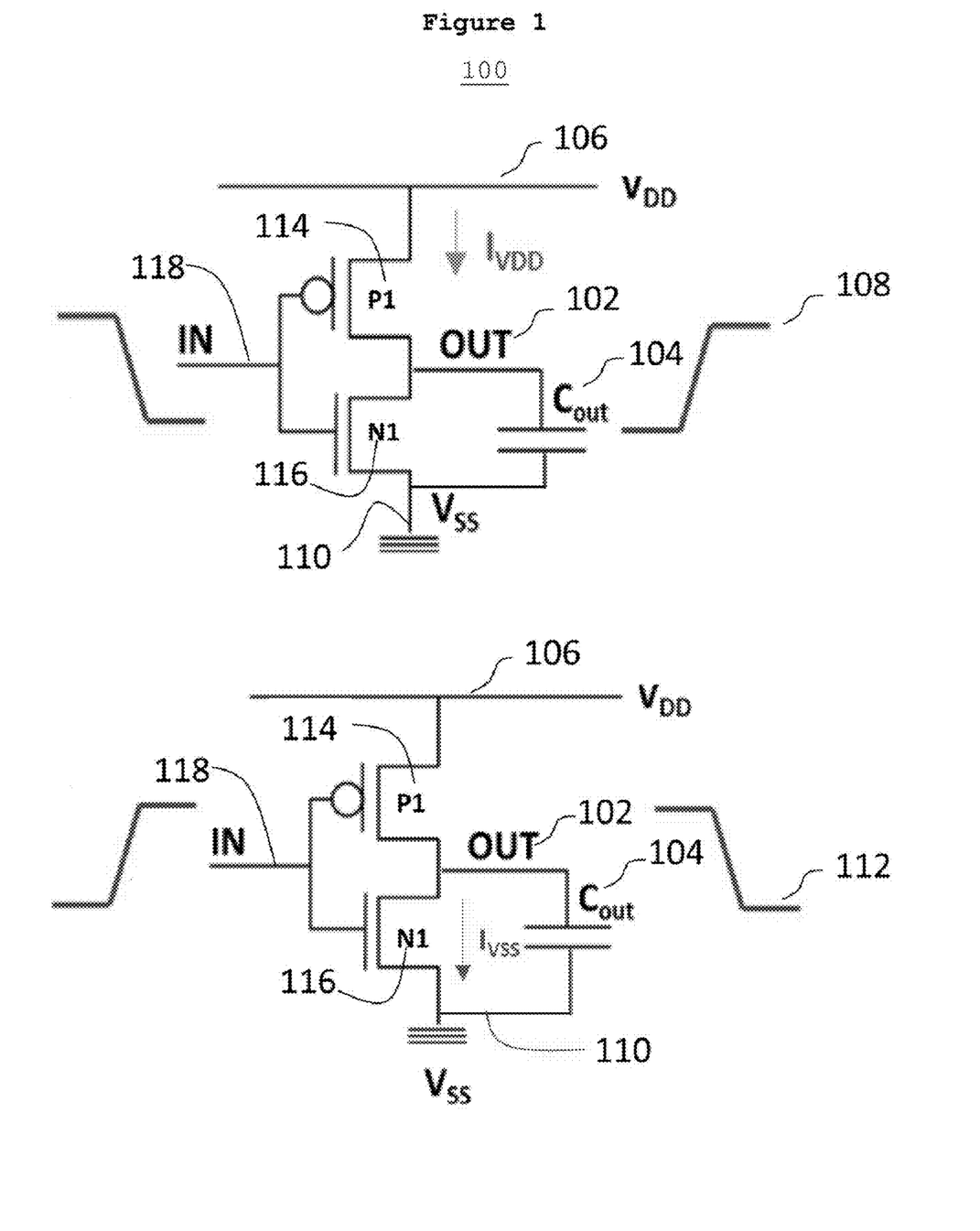
FIG. 1 is a schematic illustrating conventional CMOS circuit schematic of an inverter and its operation in response to 1→0 and 0→1 input transitions

FIG. 1 is a schematic illustrating operation of a conventional CMQS inverter 100 driving output node OUT 102 with a capacitive load $C_{out}$ 104. The power rail 106 at electric potential $V_{DD}$ provides total energy equal to $C_{out}V_{DD}^2$ (derived in equation (1) below) during a 0→1 transition 108 at the output node OUT 102, storing energy of $(½)C_{out}V_{DD}^2$ on the capacitor 104 at the output 102 modeled by equation (2) below. A 1→0 112 transition at the output 102 discharges from $C_{out}$ 104 all of this stored energy on the capacitor $C_{out}$ 104 at the output 102 to the reference ground node 110 at electric potential Vss=0V Energy drown from VDD supply (during 0→1 transition at output)

$$\int I_{VDD}(t)V_{DD}dt = \int_{VSS}^{VDD} C_{out}V_{DD}dV_{out} = C_{out}V_{DD}^2 \quad (1)$$

Energy stored at output $$\int I_{VDD}(t)V_{out}(t)dt = \int_{VSS}^{VDD} C_{out}V_{DD}dV_{out} = ½C_{out}V_{DD}^2 \quad (2)$$

Energy discharged from output (during 1→0 transition at output)

$$\int I_{VSS}(t)V_{out}(t)dt = \int_{VSS}^{VDD} C_{out}V_{DD}dV_{out} = ½C_{out}V_{DD}^2 \quad (3)$$

Figure 2:
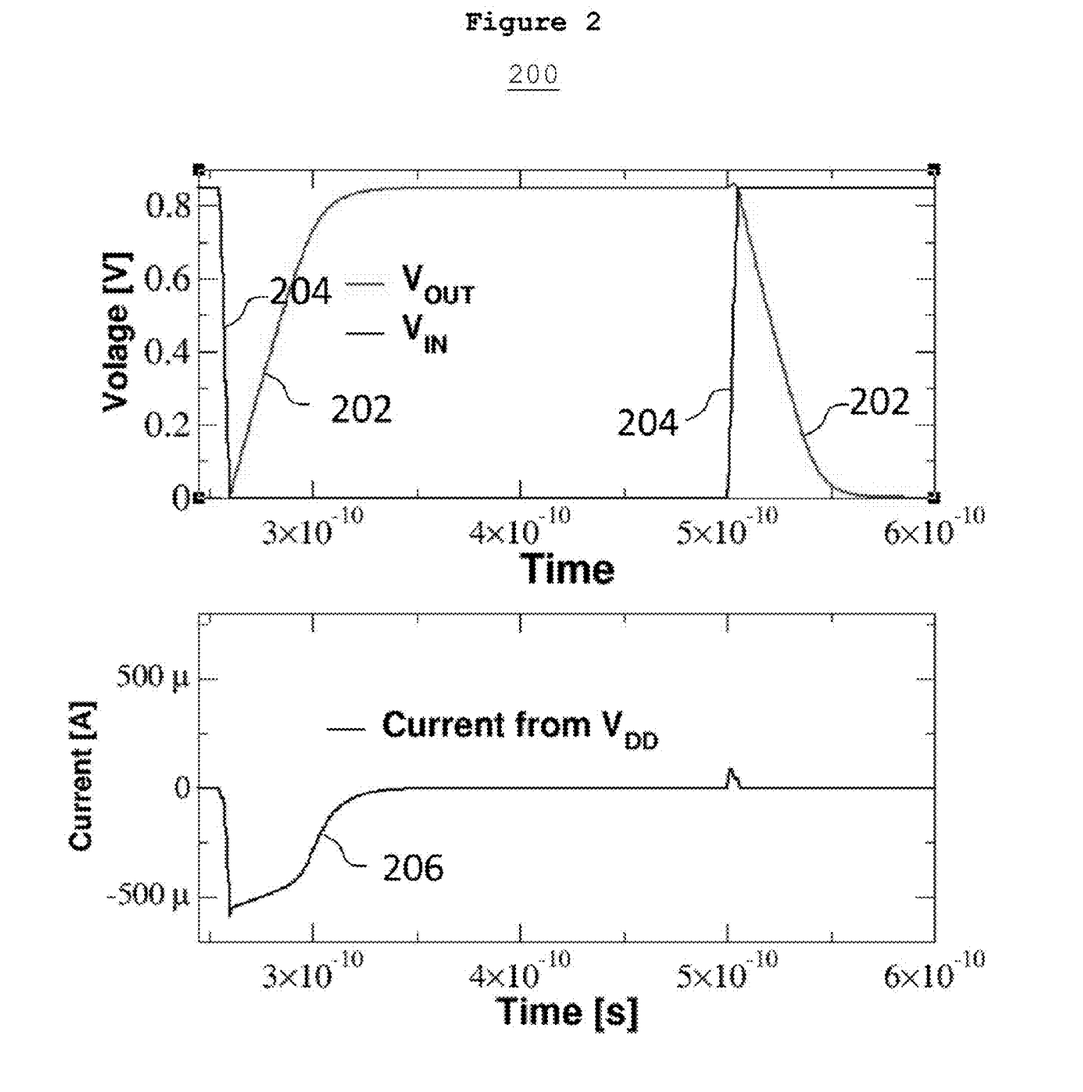
FIG. 2 is a circuit simulation: of the conventional CMOS inverter circuit that shows voltage waveforms at the input and at the output terminals of the inverter in response to 1→0 and 0→1 input transitions. The Figure also shows the current waveform that illustrates the current flow dependence on time for the 0→1 transition at the output and the 1→0 transition at the output.

FIG. 2 200 is an illustration of the time dependent voltage waveforms of the output node OUT (102 in FIG. 1 100) shown as the waveform Vout 202 in FIG. 2. The voltage waveform driving the input of the inverter 118 in FIG. 1, is shown in FIG. 2 as VIN 204

The waveform of current flow 206 into the inverter from the power rail at voltage $V_{DD}$ (106 in FIG. 1) is shown along the same x-axis of time (as used to plot voltage waveforms) in FIG. 2. The absolute value of the integral of the current waveform 206 over time in FIG. 2 200 equals the total charge Q drained from the Power rail (106 in FIG. 1) to drive the output node 102 from 0→1. The energy consumed from the power rail 106 to accomplish this logic transition at the output node 102 equals [Q•Vss]=$C_{out}V_{DD}^2$ modeled in equation (1) above.

Figure 3:
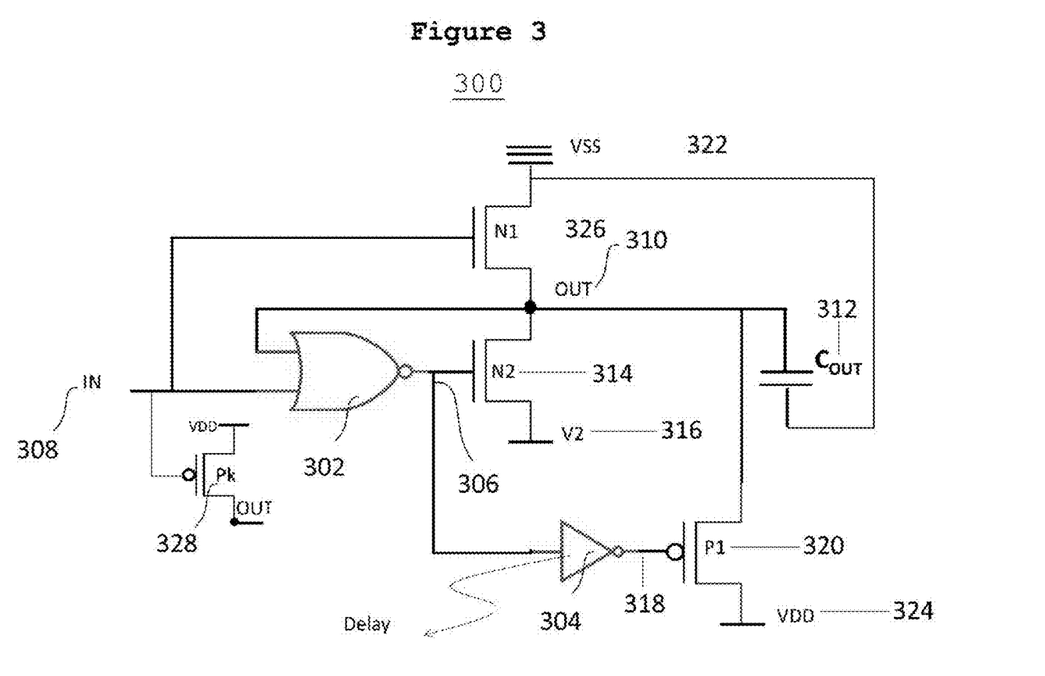
FIG. 3 is a schematic illustrating the proposed circuit Of an inverter that uses harvested charge held at a grid/node capacitance at any voltage (between the power rails at the supply voltage and the reference ground potential) to drive its output during a 0→1 voltage transition at an energy Cost of 0.6×-0.75× of that seen in a conventional CMOS inverter

In FIG. 3 the proposed circuit schematic functioning as an inverter 300 shows: a 2-input NOR 302 and a delay element 304 that also inverts. The 2-input NOR 302 and the delay element 304 have devices with much smaller widths (~⅕ of driver transistors) than the other transistors (326,314,320) in this schematic 300.

The NOR gate 302 in this schematic generates an active high pulse at its output node 306 whose leading edge is triggered by a 1→0 transition at the input 308 and whose trailing edge is triggered by a 0→1 transition at the output node 310 loaded with a total capacitance CouT 312.

The leading edge of this active high pulse turns on NFET N2 314 which drives charge harvested on the V2 node 316 (held at a voltage typically between VSS and $V_{DD}$ and preferably at a voltage comparable to the logic threshold of the NOR gate 302) to the output node 310 of this inverter.

The leading edge of the, active high pulse at the output of the NOR gate 306, when delayed and inverted to drive the gate input 318 of PFET P1 320, turns on PFET P1 320 to begin charging the output 310 to $V_{DD}$—as the output voltage at node OUT 310 approaches V2. Note that a design requirement on the logic threshold voltage of the NOR gate 302 is that it is lower than the typical voltage node V2 would be raised to with harvested charge. Thus, node OUT 310 when being charged to V2 through NFET N2 314, can trip the NOR 302 to produce the high→low transition of the active high pulse at output of the NOR gate 306 to turn-off N2 314.

The NOR 302 would also trip when the P channel FET P1 320 begins conducting after the delayed and inverted leading edge of the active high pulse output from the NOR turns on P1 320.

The output terminal continues being charged to $V_{DD}$ by the power rail 324 as P1 320 is turned on. The trailing edge of the active low pulse driving the gate input terminal of the P channel FET 320 turns this PFET 320 off. A small geometry keeper HVT PFET 328 holds the output to $V_{DD}$. Its gate input is driven by the inverter input 308 with its source terminal connected to the power rail 324 at voltage $V_{DD}$ and its drain terminal connected to OUT 310.

The trailing edge of the active high pulse at the output of the NOR 306 is triggered by the transition at the output node from 04V2 since the logic threshold of the NOR 302 is less than the voltage at which node V2 316 is charged to with harvested charge, the trailing edge is triggered by this feedback from OUT 310 to the output of the NOR 306.

The proposed circuit (1) maintains rail-rail operation (2) drives practically the same waveforms at its output as a conventional inverter and (3) uses about 25%-40% of the total charge it drives to its output 310—from the harvest grid node V2 316, instead of getting that charge from the $V_{DD}$ supply rail 324. The primary overhead in area is consumed by the NFET N2 in FIG. 3. All of the other transistors in FIG. 3 are small and can be replaced by equivalent standard cells. Transistors P1 320, NI 326 in FIG. 3 are identical to the transistors 116 and 114 in the schematic of the inverter in FIG. 1 100.

Figure 4:
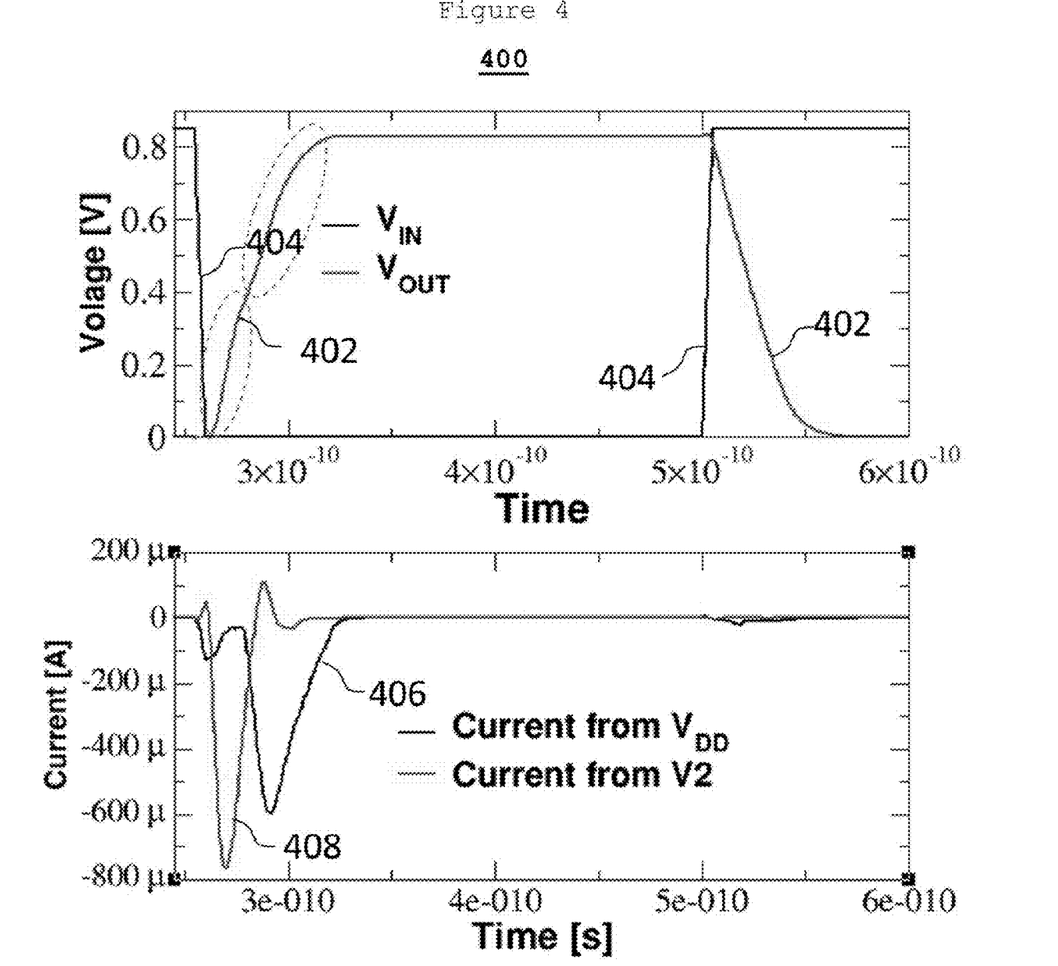
FIG. 4 is a circuit simulation of the proposed inverter circuit that uses harvested charge to power the 0→1 voltage transition at its output—showing voltage waveforms at the input and output terminals (that are practically identical to those observed in a conventional CMOS inverter (FIG. 2)) and current waveforms corresponding to current drawn from the grid holding harvested 6harge at VDD/2 and the current drawn from the power rail at voltage=VDD.

The NOR gate 302 and the delay element 304 can be optimized to maximize the energy used from the grid/node holding harvested charge according to what voltage the harvested charge is typically held at when using the proposed inverter. The closer the voltage of the harvested charge is to $V_{DD}$, the higher the optimal logic threshold voltage of the NOR gate 302 is optimized at and the longer the delay value of the delay element 304 needs to be to maximize the use of harvested charge to accomplish the same 0→1 transition at the output of the inverter. This optimization is especially useful when operating at low, near threshold voltages FIG. 4 400 is an illustration of the time dependent voltage waveforms Of the output node OUT (310 in FIG. 3) shown as $V_{OUT}$ 402 in FIG. 4. The input waveform driving the input 308 of the inverter in FIG. 3, $V_{IN}$ 404 is also shown in FIG. 4

The waveform of current flow 406 into the inverter from toe VDD power rail (324 in FIG. 3) is shown along the same x-axis (as used to plot voltage waveforms) in FIG. 4. The absolute value of the integral of Current over time in FIG. 4 400 equals the total charge Q drained from the power rail (324 in FIG. 3) to drive the output from 0→1. Note that initially the charge to drive the output in the 0→1 transition comes from the harvest charge grid/node V2 316 in FIG. 3. The total charge driven to node OUT 310 in FIG. 3 is the total area under the curves 406 and 408 in FIG. 4. This sum approximately equals the area under the current waveform 206 in FIG. 2 for the conventional CMOS inverter. Note that the voltage waveform at the output node 310 in FIG. 3 is practically the same as the voltage waveform of the output node 102 in FIG. 1 100 of a conventional inverter. However, for the schematic in FIG. 3 300 the total charge consumed from the power rail to complete the 0→1 transition at the output node 310 is only 60%-75% of the total charge taken from the power rail 106 in FIG. 1 for a conventional CMOS inverter. Total current in the comparison is based on simulation of the entire circuit shown in FIG. 1 100 and FIG. 3 300—and thus includes parasitic contributions of all transistors to circuit operation. All parasitic capacitances Of transistors in the complete schematic contribute to slew rate seen at the output and overheads incurred in propagation delay in the schematic Switching energy Consumption by logic gates with low fanouts (<4) are typically small. Gates driving a high fanout (>10) and/or long wires consume more energy and are best candidates for the proposed scheme that uses harvested charge.

The transistor energy increases in the proposed schematic shown in FIG. 3 300 compared to the 2 transistors used in a conventional CMOS inverter. However, the area consume by the proposed schematics in FIG. 3 300 does not increase proportionally with the number of translators because the transistors of gates (302, 304 in FIG. 3) are –5× smaller than any of the transistors (326, 314 and 320 in FIG. 3 300). This because the load seen by the NOR gate 302 is small—essentially just the gate input, of a single NTFT(N2 314 in FIG. 3)—with the load from the delay element 304 much smaller. The transistors P1 320, N1 326 and N2 314 in FIG. 3 are comparable (in dimensions) to the transistors P1 114 and N1 116 in a conventional CMOS inverter shown in FIG. 1 100 that drives the same capacity load CouT 104 in FIGS. 1 and 312 in FIG. 3. The gate footprint of the proposed schematic 300 (in FIG. 3) is not expected to be larger than 1.7×-2.0× of the CMOS inverter it replaces. Note that the proposed schematics are preferred as replacement candidates of CMOS inverters only when driving large loads—that offer the opportunity for larger energy reductions.

Although illustrative embodiments of the present invention have been described herein, it is to be understood that the invention is not limited to those precise embodiments, and that various other changes and modification may be made by one skilled in the art without departing from-the scope of the invention.

Abstract

Circuits and methods that use harvested electrostatic energy from transient: on-chip data are described in the Application. In one aspect, a method inverter circuit use harvested electrostatic charge held at any electric potential higher than the common ground reference potential of CMOS circuits in a chip, to partially drive a 0→1 logic transition at the output of the inverter at lower energy drain from the on-chip power grid than a conventional CMOS inverter with similar performance, slew rates at inverter input and output and with similar output driving

What is claimed is:

1. An inverter, comprising:
a first N-channel field effect transistors (NFET) and a first P-channel field effect transistors (PFET) with their drain terminals shorted together at an output terminal of the inverter, a source terminal of the first NFET being connected to a ground, a source terminal of the first PFET being connected to a power supply;
a second NFET having a source terminal and a drain terminal coupled to the output terminal with a grid/node having a capacitance configured to hold harvested charge at a voltage larger than a reference ground potential at the ground;
an input terminal and the output terminal of the inverter configured such that electric potentials make full-swing transitions between a voltage of the power supply and a voltage of the ground, the input terminal of the inverter connected directly to a gate input terminal of the first NFET;
a second PFET having (1) a gate input terminal configured to be driven by the input terminal of the inverter, (2) a source terminal that is connected to the power supply, and (3) a drain terminal that is connected to the output terminal of the inverter; and
a 2-input NOR gate having inputs configured to be driven by the input terminal and the output terminal of the inverter, an output of the 2-input NOR gate configured to drive the gate input terminal of the second NFET and the input terminal of a delay element that is configured to have an inverted output that drives the first PFET.

2. The inverter as recited in claim 1, wherein the second NFET is configured to move the harvested charge from the grid/node to the output terminal of the inverter following a high-to-low logic transition at the input terminal of the inverter with charge transfer being self-disabled by a rising inverter output voltage that resets an output of the 2-input NOR gate to the reference ground potential as the inverter output voltage approaches a logic threshold voltage of the 2-input NOR gate.

3. The inverter as recited in claim 2, wherein the rising inverter output voltage is reinforced by the first PFET of the inverter when a delayed, leading-edge of the high-to-low logic transition at the gate input terminal of the first PFET completes a low-to-high logic transition at the output of the inverter by transferring charge from the power supply to the output of the inverter.

4. The inverter as recited in claim 1, wherein:
the 2-input NOR gate having a logic threshold comparable to a voltage of the harvested charge;
the delay element configured to provide a delay that is comparable to a time for a voltage of the output to rise to the voltage comparable to the logic threshold of the 2-input NOR gate.

5. An apparatus, comprising:
an inverter that includes a power supply, an input terminal an output terminal, a p-channel field effect transistor (PFET), an n-channel field effect transistor (NFET), and a harvest terminal,
the inverter configured to be responsive to a high-to-low transition at the input terminal and configured to (1) electrically couple, via the NFET, the output terminal to the harvest terminal until an electric potential at the output terminal approaches an electric potential of the harvest terminal, and (2) electrically couple, via the PFET, the power supply to the output terminal while decoupling, via the NFET, the output terminal from the harvest terminal in response to the electric potential at the output terminal increasing to a voltage approximately less than or equal to the electric potential at the harvest terminal.

6. The apparatus of claim 5, wherein the inverter includes a NOR gate, the NOR gate including a first NOR gate input terminal coupled to the input terminal of the inverter and a second NOR gate input terminal coupled to the output terminal of the inverter, the NOR gate configured to generate an active high pulse at an output terminal of the NOR gate initiated by the high-to-low transition at the input terminal of the inverter.

7. The apparatus of claim 5, wherein:
the NFET is a first NFET, the inverter further includes:
a NOR gate, the NOR gate including a first NOR gate input terminal coupled to the input terminal of the inverter and a second NOR gate input terminal coupled to the output terminal of the inverter, the NOR gate configured to generate, at an output terminal of the NOR gate, an active high pulse initiated by the high-to-low transition at the input terminal of the inverter; and
a second NFET having a gate terminal electrically coupled to the input terminal of the inverter, a source terminal electrically coupled to ground, and a drain terminal electrically coupled to the output terminal of the inverter, a low-to-high transition at the input terminal of the inverter and the gate terminal configured to electrically couple the ground to the output terminal of the inverter, to produce a high-to-low transition at the output terminal of the inverter.

8. The apparatus of claim 5, wherein the inverter includes:
a NOR gate, the NOR gate including a first NOR gate input terminal coupled to the input terminal of the inverter and a second NOR gate input terminal coupled to the output terminal of the inverter, the NOR gate configured to generate, at an output terminal of the NOR gate, an active high pulse initiated by the high-to-low transition at the input terminal of the inverter,
the NFET having a gate terminal electrically coupled to the output terminal of the NOR gate, a source terminal electrically coupled to the harvest terminal, and a drain terminal electrically coupled to the output terminal of the inverter, the NFET configured to electrically couple the output terminal of the inverter to the harvest terminal in response to the gate terminal of the NFET being driven by a leading edge of the active high pulse from the output terminal of the NOR gate.

9. The apparatus of claim 5, wherein the inverter includes:
a NOR gate, the NOR gate including a first NOR gate input terminal, a second NOR gate input terminal, and an output terminal, the first NOR gate input terminal electrically coupled to the input terminal of the inverter, the second NOR gate input terminal electrically coupled to the output terminal of the inverter, the output terminal of the NOR gate electrically coupled to an input terminal of an inverting delay element, the NOR gate configured to generate, at the output terminal of the NOR gate, an active high pulse initiated by the high-to-low transition at the input terminal of the inverter, and
the PFET having a gate terminal electrically coupled to an output terminal of the inverting delay element, a drain terminal electrically coupled to the output terminal of the inverter, and a source terminal electrically coupled to the power supply, such that, at the output terminal of the inverting delay element, the active high pulse is delayed and inverted by the inverting delay element.

10. The apparatus of claim 5, wherein:
the NFET is a first NFET, the inverter further including:
  a NOR gate, the NOR gate including a first NOR gate input terminal, a second NOR gate input terminal, and an output terminal, the first NOR gate input terminal electrically coupled to the input terminal of the inverter, the second NOR gate input terminal electrically coupled to the output terminal of the inverter, the output terminal of the NOR gate electrically coupled to an input terminal of an inverting delay element, the NOR gate configured to generate, at the output terminal of the NOR gate, an active high pulse in response to the high-to-low transition at the input terminal of the inverter; and
  a second NFET having a gate terminal electrically coupled to the input terminal of the inverter, a drain terminal electrically coupled to the output terminal of the inverter, and a source terminal electrically coupled to ground, the PFET configured to maintain a low impedance path between the output terminal and the ground when a voltage at the input terminal of the inverter input is low.

11. The apparatus of claim 5, wherein the inverter includes:
  a NOR gate that has a first NOR gate input terminal coupled to the input terminal of the inverter and a second NOR gate input terminal coupled to the output terminal of the inverter, the NOR gate configured to generate, at an output terminal of the NOR gate, an active high pulse in response to the high-to-low transition at the input terminal of the inverter,
  the PFET having a drain terminal electrically coupled to the output terminal of the inverter, a gate terminal electrically coupled to an output terminal of an inverting delay element, and a source terminal electrically coupled to the power supply, the PFET configured to transfer charge from the power supply to the output terminal of the inverter in response to an output voltage at the output terminal of the inverter increasing as the output voltage approaches a voltage at the harvest terminal and a logic threshold voltage of the NOR gate.

12. The apparatus of claim 5, wherein the inverter includes:
  a NOR gate, the NOR gate including a first NOR gate input terminal coupled to the input terminal of the inverter and a second NOR gate input terminal coupled to the output terminal of the inverter, the NOR gate configured to generate, at an output terminal of the NOR gate, an active high pulse initiated by the high-to-low transition at the input terminal of the inverter, and
  the NFET electrically coupled to the output terminal of the NOR gate, the output terminal of the inverter, and the harvest terminal, the NFET configured to be turned on by a leading edge of the active high pulse and to transfer charge from the harvest terminal to the output terminal of the inverter as an output voltage at the output terminal of the inverter increases until the output voltage approaches a logic threshold voltage of the NOR gate.

13. The apparatus of claim 5, wherein:
the NFET is a first NFET, and
the inverter further including:
  a NOR gate, the NOR gate including a first NOR gate input terminal coupled to the input terminal of the inverter and a second NOR gate input terminal coupled to the output terminal of the inverter, the NOR gate configured to generate, at an output terminal of the NOR gate, an active high pulse initiated by the high-to-low transition at the input terminal of the inverter; and
  a second NFET including a gate terminal electrically coupled to the input terminal of the inverter, a source terminal electrically coupled to a ground, and a drain terminal electrically coupled to the output terminal of the inverter, a low-to-high transition at the input terminal of the inverter and the gate terminal of the second NFET configured to electrically couple the ground to the output terminal of the inverter, to produce a high-to-low transition at the output of the inverter,
  the first NFET having a gate terminal electrically coupled to the output terminal of the NOR gate, a source terminal electrically coupled to the harvest terminal, and a drain terminal electrically coupled to the output terminal of the inverter, the first NFET configured to electrically couple the output terminal of the inverter to the harvest terminal and to transfer harvested charge from the harvest terminal to the output terminal of the inverter such that the transferring of the harvested charge is self-disabled by a rising inverter output voltage at the output terminal of the invert that resets an output of the NOR gate to the ground as the inverter output voltage approaches a logic threshold voltage of the NOR gate.

14. The apparatus of claim 5, wherein the inverter includes:
  a NOR gate, the NOR gate including a first NOR gate input terminal coupled to the input terminal of the inverter and a second NOR gate input terminal coupled to the output terminal of the inverter, the NOR gate configured to generate, at an output terminal of the NOR gate, an active high pulse initiated by the high-to-low transition at the input terminal of the inverter such that the NOR gate produces no transition at the output terminal of the NOR gate in response to a low-to-high transition at the input of the inverter.

15. An apparatus, comprising:
an inverter having an input terminal and an output terminal;
a first N-channel field-effect transistor (NFET);
a second NFET connected in series with the first NFET, the first NFET having a source terminal configured to be connected to ground and having a gate terminal connected to the input terminal of the inverter, the second NFET having a source terminal configured to be connected to the output terminal of the inverter and a drain terminal configured to be connected to a harvest terminal;
a P-channel field-effect transistor (PFET) having a drain terminal connected to a drain terminal of the first NFET and at the output terminal of the inverter, the PFET having a source terminal configured to be connected to a power supply terminal; and
a NOR gate with a first NOR input terminal and a second NOR input terminal, the first NOR input terminal and the second NOR input terminal of the NOR gate being connected with and configured to be driven by the input terminal of the inverter and the output terminal of the inverter, the NOR gate having an output terminal connected with a gate input terminal of the second NFET and an input terminal of an inverting delay element whose output terminal configured to be connected with the PFET of the inverter, the NOR gate configured to generate an active high pulse at the output terminal of the NOR gate.

16. The apparatus of claim 15, wherein the NOR gate and the inverting delay element are collectively configured to maximize energy from harvested charge at the harvest terminal.

17. The apparatus of claim 15, wherein the NOR gate is configured to generate, at the output terminal of the NOR gate, the active high pulse initiated by a high-to-low transition at the input terminal of the inverter, the active high pulse including a leading edge such that the NOR gate is triggered, by the high-to-low transition at the input terminal of the inverter, to begin transferring charge from the harvest terminal to the output terminal of the inverter triggered by the leading edge of the active high pulse until an output voltage at the output terminal of the inverter increases past a logic threshold of the NOR gate.

18. The apparatus of claim 15, wherein:
the P-channel field-effect transistor (PFET) is configured to transfer a charge to the output terminal of the inverter from the power supply terminal in response to an output voltage at the output terminal of the inverter decreasing past a logic threshold of the NOR gate.

19. The apparatus of claim 15, wherein:
the second NFET is configured to be turned on by the active high pulse and transfer a charge from the harvest terminal to the output terminal of the inverter until an output voltage at the output terminal of the inverter rises past a logic threshold of the NOR gate.

20. The apparatus of claim 15, wherein the NOR gate is configured to generate, at the output terminal of the NOR gate, the active high pulse initiated by a high-to-low transition at the input terminal of the inverter, the second NFET configured to be turned on by the active high pulse and configured to transfer a charge from the harvest terminal until an output voltage at the output terminal of the inverter rises past a logic threshold of the NOR gate.

* * * * *

UNITED STATES PATENT AND TRADEMARK OFFICE
CERTIFICATE OF CORRECTION

PATENT NO. : 11,984,887 B2
APPLICATION NO. : 17/497974
DATED : May 14, 2024
INVENTOR(S) : Azeez Bhavnagarwala It is certified that error appears in the above-identified patent and that said Letters Patent is hereby corrected as shown below:

In the Specification

Column 4, Line 38: "$\int I_{vDD}(t) V_{out}(t) dt = \int_{VSS}^{VDD} C_{out} V_{DD} dV_{out} = 1/2 \, C_{out} V_{DD}^2 \quad (2)$,, should read -- $\int I_{vDD}(t) V_{out}(t) dt = \int_{VSS}^{VDD} C_{out} V_{out} dV_{out} = 1/2 \, C_{out} V_{DD}^2 \quad (2)$ --

In the Claims

Column 9, Line 22 (Claim 10, Line 22): "of the inverter input is low" should read -- of the inverter is low --

Signed and Sealed this
Eighteenth Day of June, 2024

Katherine Kelly Vidal
*Director of the United States Patent and Trademark Office*